(12) United States Patent  
Huang

(10) Patent No.: US 8,362,847 B2
(45) Date of Patent: Jan. 29, 2013

(54) OSCILLATOR CIRCUIT AND METHOD OF IMPROVING NOISE IMMUNITY

(75) Inventor: Tian-Jian Huang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 43 days.

(21) Appl. No.: 12/904,572

(22) Filed: Oct. 14, 2010

(65) Prior Publication Data

US 2012/0092079 A1    Apr. 19, 2012

(51) Int. Cl.
*B03B 5/32* (2006.01)
(52) U.S. Cl. ........................................ 331/160; 331/109

(58) Field of Classification Search .................. 331/160, 331/109, 158
See application file for complete search history.

(56) References Cited

U.S. PATENT DOCUMENTS

| | | | |
|---|---|---|---|
| 7,088,196 B2 * | 8/2006 | Ashida et al. | 331/158 |
| 8,044,731 B2 * | 10/2011 | Arai | 331/116 FE |
| 2004/0113709 A1 * | 6/2004 | Sibrai et al. | 331/182 |
| 2008/0252390 A1 * | 10/2008 | Guerreiro | 331/116 FE |

* cited by examiner

*Primary Examiner* — Joseph Chang
(74) *Attorney, Agent, or Firm* — Lowe Hauptman Ham & Berner, LLP

(57) ABSTRACT

Noise immunity of an oscillator circuit is improved by either increasing the oscillation amplitude of the core's oscillating signal or configuring a built-in low pass filter.

18 Claims, 6 Drawing Sheets

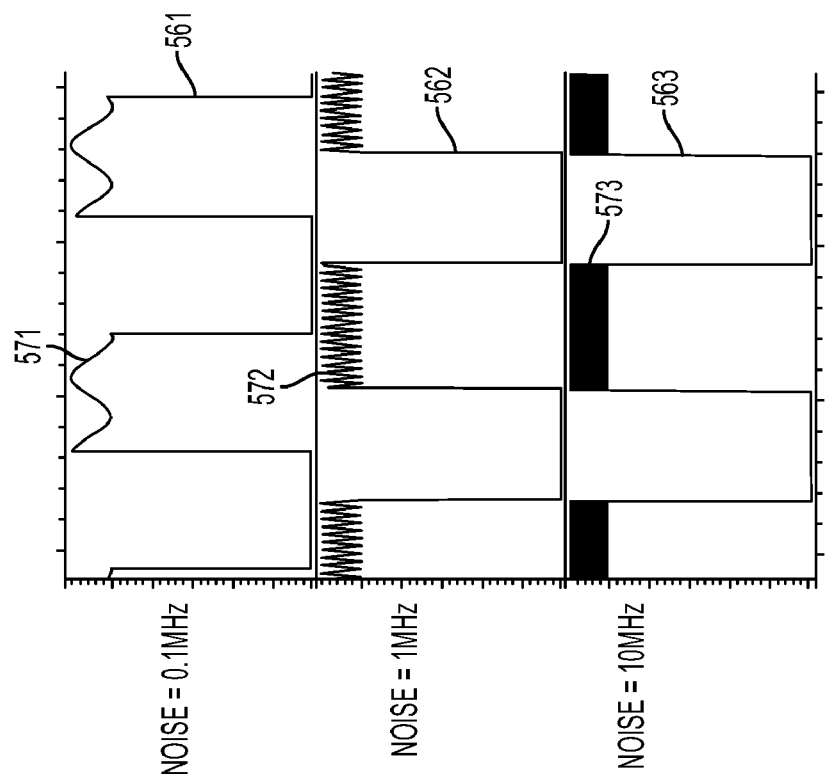
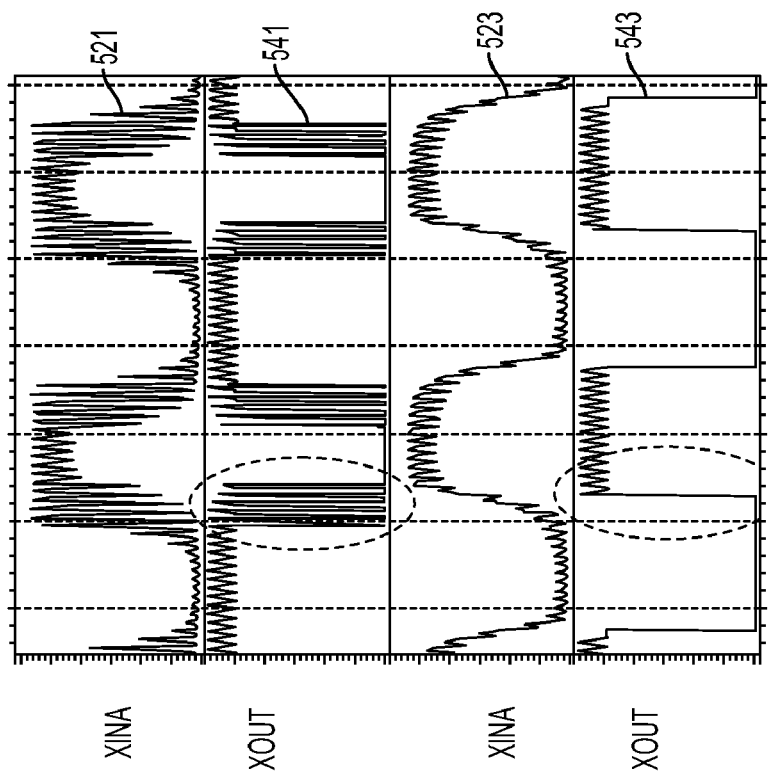
FIG. 5B
FIG. 5A

OSCILLATOR CIRCUIT AND METHOD OF IMPROVING NOISE IMMUNITY

BACKGROUND

Oscillators are widely used in electronic devices to provide reliable clock signals or timing features for other components of the electronic devices. As electronic devices become more complex and shrink in size, operational requirements for oscillators also become more demanding. One of such operational requirements includes noise immunity.

Noise immunity is a particular concern in oscillators that operate at reduced operating voltages. For example, noises coupled from the power bus of an oscillator may cause undesirable glitches or jitters in the oscillator's output. As the operating voltage reduces, such glitches or jitters become noticeable and, under certain circumstances, unacceptable.

BRIEF DESCRIPTION OF THE DRAWINGS

One or more embodiments are illustrated by way of example, and not by limitation, in the figures of the accompanying drawings, wherein elements having the same reference numeral designations represent like elements throughout and wherein:

FIGS. 5A and 5B are exemplary time diagrams of various nodes in various oscillator circuits.

DETAILED DESCRIPTION

Figure 1A:
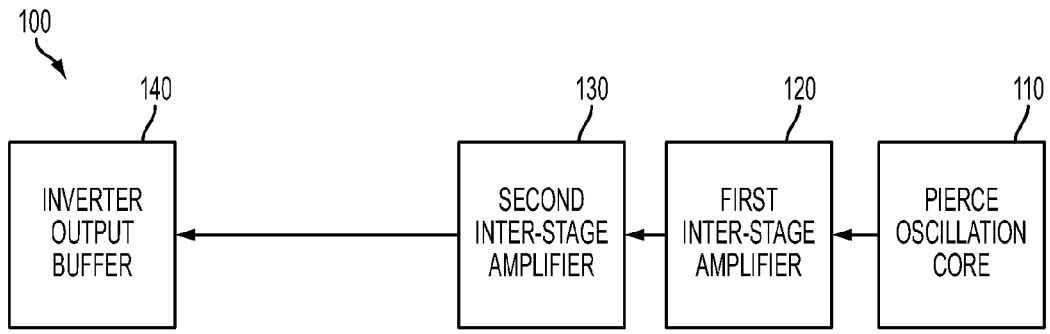
FIGS. 1A and 2A are block diagrams and FIGS. 1B and 2B are high-level circuit diagrams of various oscillator circuits.

The below descriptions describe exemplary embodiments of oscillator circuits and chips (integrated circuits) with improved noise immunity, as well as methods of improving noise immunity in oscillator circuits and chips. In some embodiments, the oscillation amplitude of an oscillating signal outputted by an oscillation core of an oscillator circuit is enlarged, e.g., by an appropriate biasing voltage, to thereby reduce undesirable effects of noises, e.g., from the power bus of the oscillation core, on the oscillating signal. In further embodiments, a configuration of a chip in/for an oscillator circuit is modified to include a low pass filter (LPF) for filtering out high frequency noises from the oscillating signal. In yet further embodiments, both approaches are implemented in a single oscillator circuit or chip to improve noise immunity.

The use of "an embodiment" or "one embodiment" herein is not intended to convey that the descriptions pertain to a single embodiment, but that the features described are present in at least one embodiment. Like features will generally be referred to with like reference numerals, but this is also not intended to denote a requirement that the same features appear in each embodiment. Also, features depicted in the figures are not drawn to scale and therefore should not be construed to place particular size limitations on the embodiments described.

FIG. 1A is a block diagram of an oscillator circuit 100.

Oscillator circuit 100 includes a Pierce oscillation core 110, a first inter-stage amplifier 120, a second inter-stage amplifier 130, and an inverter output buffer 140, connected in series in the recited order. Pierce oscillation core 110 generates an oscillating signal which is sequentially amplified by first inter-stage amplifier 120 and second inter-stage amplifier 130 before being outputted by inverter output buffer 140.

Figure 1B:
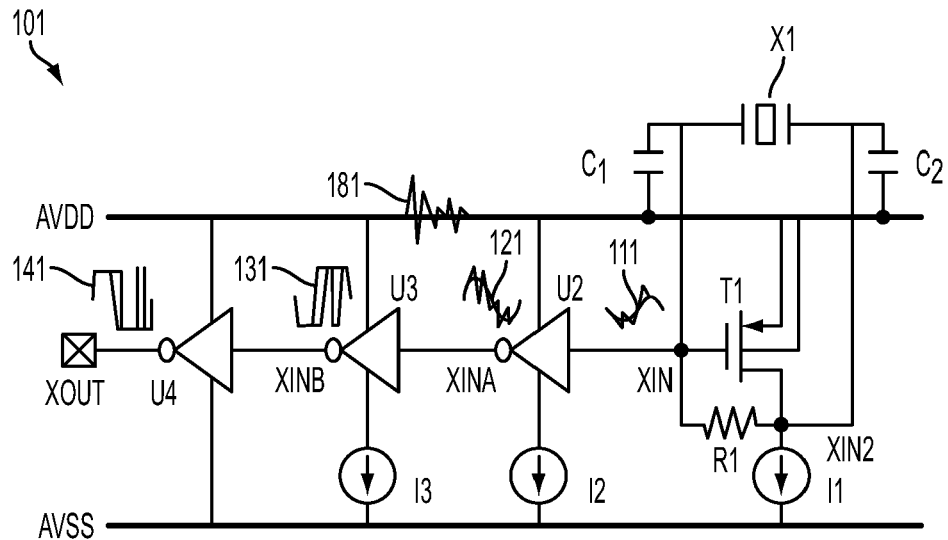

FIG. 1B is a high-level circuit diagram of an oscillator circuit 101 implementing the configuration of the oscillator circuit 100 of FIG. 1A.

Pierce oscillation core 110 of FIG. 1A is implemented in oscillator circuit 101 of FIG. 1B as including a crystal X1, two capacitors C1, C2, a resistor R1, a core transistor T1, and a current source I1. Crystal X1 is coupled between capacitors C1, C2. More specifically, an end of crystal X1 is coupled to one end of capacitor C1 and to a node XIN of Pierce oscillation core 110. Another end of crystal X1 is coupled to one end of capacitor C2 and to a node XIN2 of Pierce oscillation core 110. The opposite ends of capacitors C1, C2 are coupled to a power bus AVDD that supplies an operating or supply voltage to oscillator circuit 101. Resistor R1 is coupled between nodes XIN and XIN2. A gate of core transistor T1 is coupled to node XIN. A source and a body (substrate) of core transistor T1 are coupled to power bus AVDD. A drain of core transistor T1 is coupled to an end of current source I1 the other end of which is coupled to a low voltage line AVSS hereinafter referred to as "ground".

First inter-stage amplifier 120, second inter-stage amplifier 130 and inverter output buffer 140 of FIG. 1A are also implemented in oscillator circuit 101 of FIG. 1B. Specifically, first inter-stage amplifier 120 includes an inverting amplifier U2 and a current source I2 coupled in series between power bus AVDD and ground AVSS. Likewise, second inter-stage amplifier 130 includes an inverting amplifier U3 and a current source I3 coupled in series between power bus AVDD and ground AVSS. Inverter output buffer 140 includes an inverting amplifier U4 coupled between power bus AVDD and ground AVSS.

An input of inverting amplifier U2 is coupled to node XIN of Pierce oscillation core 110 to receive an oscillating signal 111 generated by Pierce oscillation core 110 at node XIN. As illustrated in FIG. 1B, oscillating signal 111 is effected by noises 181 on power bus AVDD. First inter-stage amplifier 120 inverts and amplifies oscillating signal 111 to output a first amplified oscillating signal 121 at a node XINA, e.g., an output of inverting amplifier U2. At the same time, first inter-stage amplifier 120 also amplifies the noise in oscillating signal 111. As a result, noise in first amplified oscillating signal 121 becomes greater than in oscillating signal 111.

An input of inverting amplifier U3 is coupled to node XINA to receive first amplified oscillating signal 121 generated by first inter-stage amplifier 120. Second inter-stage amplifier 130 inverts and further amplifies first amplified oscillating signal 121 to output a second amplified oscillating signal 131 at a node XINB, e.g., an output of inverting amplifier U3. At the same time, second inter-stage amplifier 130 also amplifies the noise in first amplified oscillating signal 121. As a result, noise in second amplified oscillating signal 131 becomes greater than in first amplified oscillating signal 121.

An input of inverting amplifier U4 of inverter output buffer 140 is coupled to node XINB to receive second amplified oscillating signal 131 generated by second inter-stage amplifier 130. Inverter output buffer 140 inverts second amplified oscillating signal 131 and produces therefrom an output signal 141 of a desired signal level at a node XOUT, e.g., an output of inverting amplifier U4. As illustrated in FIG. 1B, output signal 141 includes glitches resulting from noise in power bus AVDD.

Figure 2A:
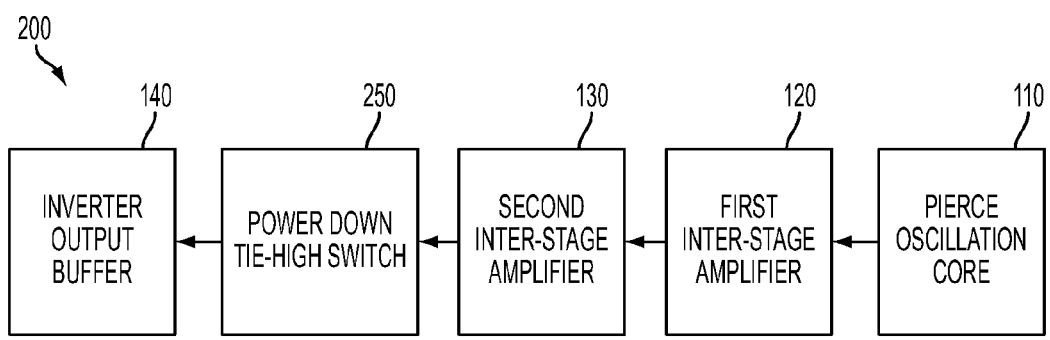

FIG. 2A is a block diagram of another oscillator circuit 200.

Oscillator circuit 200 is similar to oscillator circuit 100 in that it also includes a Pierce oscillation core 110, a first inter-stage amplifier 120, a second inter-stage amplifier 130, and an inverter output buffer 140, connected in series in the recited order. Oscillator circuit 200 differs from oscillator circuit 100 in additionally including a power-down tie-high switch 250 coupled between second inter-stage amplifier 130 and inverter output buffer 140.

Figure 2B:
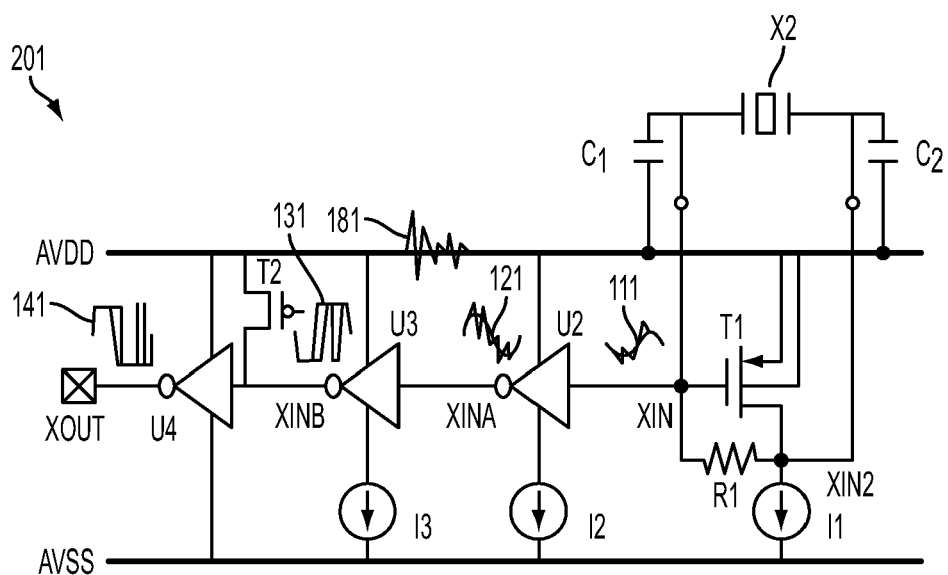

FIG. 2B is a high-level circuit diagram of an oscillator circuit 201 implementing the configuration of the oscillator circuit 200 of FIG. 2A.

FIG. 2B is similar to FIG. 1B except for the implementation of power-down tie-high switch 250 as including a transistor T2. One of a source and a drain of transistor T2 is coupled to power bus AVDD, whereas the other of the source and the drain of transistor T2 is coupled to node XINB. A gate of transistor T2 is coupled to an enable pin (not shown).

The purpose of power-down tie-high switch 250 is to lock the output signal 141 at node XOUT at a stable logic state during a time period in which oscillator circuit 201 is not in use or is powered down. Also, to avoiding leakage at output inverter 140. Specifically, when an appropriate signal, e.g., a power-down signal, is applied to the gate of transistor T2 via the enable pin (not shown), transistor T2 is (ON) to tie node XINB high to power bus AVDD. As a result, the input of inverting amplifier U4 of inverter output buffer 140 remains at a high level (e.g., Vdd of power bus AVDD) until the power-down signal is removed from the enable pin, i.e., from the gate of transistor T2. Consequently, output signal 141 at node XOUT is locked at a low level until the power-down signal is removed at which time output signal 141 at node XOUT again follows the oscillations of oscillating signal 111.

Notwithstanding the additional provision of power-down tie-high switch 250, output signal 141, during a time period in which oscillator circuit 201 is powered, may still suffer from glitches associated with noise coupled from power bus AVDD, as discussed with respect to oscillator circuit 101 in FIG. 1B.

To improve noise immunity of oscillator circuits, such as oscillator circuits 100, 101, 200, 201, there are several approaches. For example, one approach provides a separate, dedicated high frequency filter, which often includes multiple circuit components, to remove noise from the output signal or intermediate signals of the oscillator circuit. Another approach is to provide a separate dedicated power domain circuit for the oscillator circuit as a whole, or for one or more of its components, e.g., the oscillation core. The above mentioned approaches require complex circuits which often need more area on the chip and/or more power consumption and/or more voltage headroom. A separate dedicated power domain circuit, under certain circumstances, also results in weaker electro-static discharge (ESD) performance.

Figure 3A:
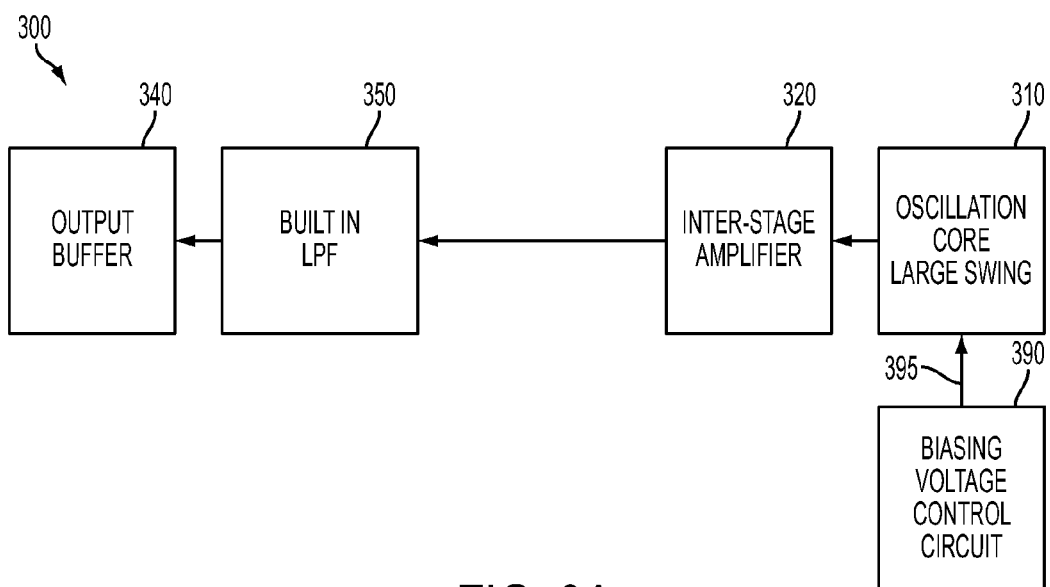
FIG. 3A is a block diagram and FIGS. 3B-3C are high-level circuit diagrams of oscillator circuits accordance with various embodiments.

FIG. 3A is a block diagram of an oscillator circuit 300 in accordance with one or more embodiments.

Oscillator circuit 300 includes an oscillation core 310, an inter-stage (intermediate) amplifier 320, a built-in LPF 350 and an output buffer 340 connected in series in the recited order. Oscillator circuit 300 further includes a biasing voltage control circuit 390 coupled to oscillation core 310 at node 395 to control an oscillating signal generated by oscillation core 310. The oscillating signal is sequentially amplified by intermediate amplifier 320 and filtered by LPF 350 before being outputted by output buffer 340. Biasing voltage control circuit 390 and/or LPF 350 is/are operable to improve noise immunity of oscillator circuit 300.

In some embodiments, intermediate amplifier 320 or LPF 350 or both is/are omitted from oscillator circuit 300. In such embodiments, biasing voltage control circuit 390 improves the noise immunity of oscillator circuit 300.

In further embodiments, intermediate amplifier 320 or biasing voltage control circuit 390 or both is/are omitted from oscillator circuit 300. In such embodiments, LPF 350 improves the noise immunity of oscillator circuit 300.

Figure 3B:
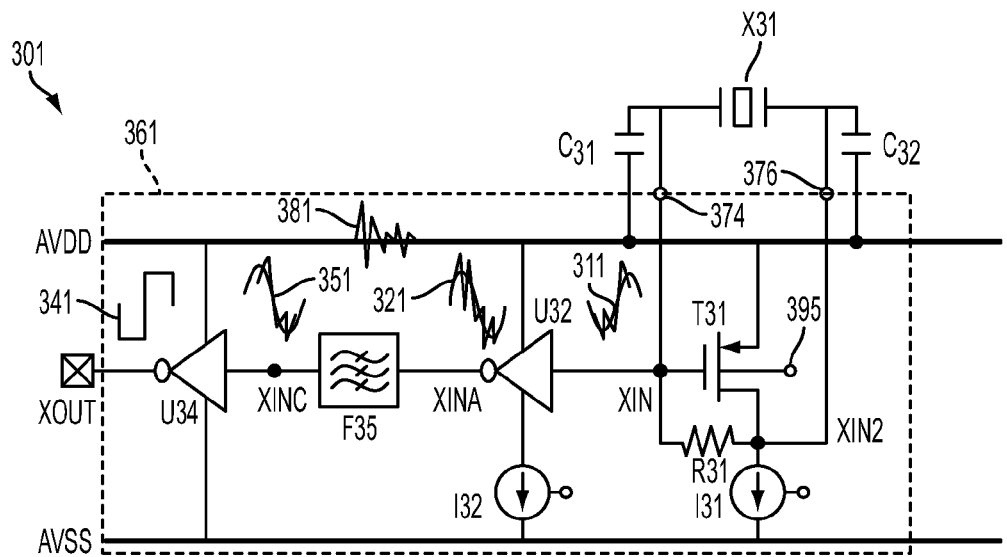

FIG. 3B is a high-level circuit diagram of an oscillator circuit 301 in accordance with one or more embodiments implementing the configuration of the oscillator circuit 300 of FIG. 3A.

Oscillation core 310 of FIG. 3A is implemented in oscillator circuit 301 of FIG. 3B as including an oscillator element X31, e.g., a crystal. Oscillation core 310 also includes capacitors C31, C32, a resistor R31, a core transistor T31, and a current source I31. Crystal X31 is coupled between capacitors C31, C32. More specifically, an end of crystal X31 is coupled to one end of capacitor C31 and to a node XIN of oscillation core 310. Another end of crystal X31 is coupled to one end of capacitor C32 and to a node XIN2 of oscillation core 310. The opposite ends of capacitors C31, C32 are coupled to a power bus AVDD that supplies an operating or supply voltage to oscillator circuit 301. Resistor R31 is coupled between nodes XIN and XIN2. A gate of core transistor T31 is coupled to node 395 of biasing voltage control circuit 390 (not shown in FIG. 3B). A source of core transistor T31 is coupled to power bus AVDD. A drain of core transistor T31 is coupled to an end of current source I31 the other end of which is coupled to a low voltage line AVSS hereinafter referred to as "ground".

Intermediate amplifier 320 and output buffer 340 of FIG. 3A are also implemented in oscillator circuit 301 of FIG. 3B. Specifically, intermediate amplifier 320 includes an inverting amplifier U32 and a current source I32 coupled in series between power bus AVDD and ground AVSS. Output buffer 340 includes an inverting amplifier U34 coupled between power bus AVDD and ground AVSS.

LPF 350 is implemented in oscillator circuit 301 of FIG. 3B as an LPF F35 coupled between inverting amplifier U32 of intermediate amplifier 320 and inverting amplifier U34 of output buffer 340.

An input of inverting amplifier U32 of intermediate amplifier 320 is coupled to node XIN of oscillation core 310 to receive an oscillating signal 311 generated by oscillation core 310 at node XIN. Intermediate amplifier 320 inverts and amplifies oscillating signal 311 to output an amplified oscillating signal 321 at a node XINA, e.g., an output of inverting amplifier U32.

An input of LPF F35 which implements the function of LPF 350 is coupled to node XINA to receive amplified oscillating signal 321 generated by intermediate amplifier 320. LPF F35 filters out noise of frequencies higher than a predetermined frequency of LPF F35 from amplified oscillating signal 321. As a result, an amplified and filtered oscillating signal 351 is outputted at a node XINC, e.g., an output of LPF F35.

An input of inverting amplifier U34 of output buffer 340 is coupled to node XINC to receive amplified and filtered oscillating signal 351 generated by LPF F35. Output buffer 340 inverts amplified and filtered oscillating signal 351 and produces therefrom an output signal 341 of a desired signal level at a node XOUT, e.g., an output of inverting amplifier U34.

With specific reference to the noise immunity capability of oscillator circuit 301, oscillating signal 311 is generated by oscillation core 310 which, in some embodiments, is a Pierce oscillation core that uses oscillator element X31, capacitors C31, C32, core transistor T31, and resistor R31 to provide a predetermined waveform at a predetermined frequency as oscillating signal 311. Oscillator element X31, e.g., a crystal, is typically operated as an inductive element. The inductance of oscillator element X31 in combination with capacitance of capacitors C31, C32 forms an "LC oscillation circuit" the timing of which is adjustable by appropriately selecting the capacitance of capacitors C31, C32 and/or the resistance of resistor R31.

When core transistor T31 is open (ON) or conductive, a current flows from power bus AVDD via core transistor T31 to charge the "LC oscillation circuit." This process corresponds to a first half period where oscillating signal 311 rises from a lower peak to an upper peak.

When core transistor T31 is closed (OFF), the "LC oscillation circuit" discharges to ground AVSS via current source 131. This process corresponds to a second half period where oscillating signal 311 falls from the upper peak to the lower peak. The potential difference between the upper peak and the lower peak is the oscillation amplitude (or "peak-to-peak swing") of oscillating signal 311.

There is a possibility that oscillating signal 311 is effected by noise, e.g., 381 in FIG. 3B, on power bus AVDD. Several approaches are provided for suppressing such noise from appearing on output signal 341 of oscillator circuit 301.

In one or more embodiments in accordance with a first approach, the signal-to-noise ratio (SNR) of oscillating signal 311 is improved by increasing the "peak-to-peak swing" of oscillating signal 311, because at the same noise level, a larger "peak-to-peak swing" will result in a lower SNR.

In some embodiments, lowering the threshold voltage of core transistor T31 increases the "peak-to-peak swing" of oscillating signal 311. As the threshold voltage of core transistor T31 becomes lower, core transistor T31 will be closed (OFF) at larger signal swing, the "LC oscillation circuit" of oscillation core 310 will be charged more fully, and the "peak-to-peak swing" or oscillation amplitude of oscillating signal 311 will be greater.

In accordance with one or more embodiments, the threshold voltage of core transistor T31 is lowered by a biasing voltage applied from biasing voltage control circuit 390 via node 395 to core transistor T31 of oscillation core 310. In an exemplary embodiment where core transistor T31 is a metal-oxide-semiconductor (MOS) transistor, the core transistor T31 threshold voltage is adjusted by substrate and/or well biasing.

Figure 6:
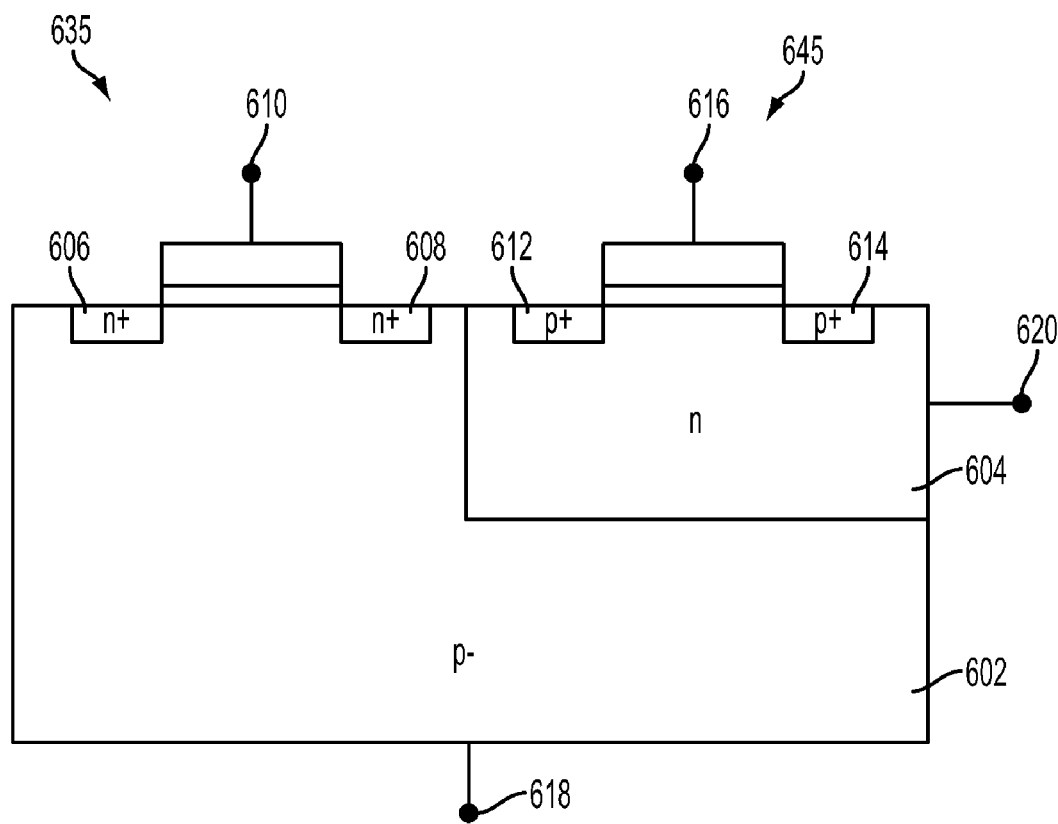
FIG. 6 is a schematic cross-section of a metal-oxide-semiconductor structure that illustrates a principle applicable in one or more embodiments.

FIG. 6 is a schematic cross-section of a MOS structure that illustrates a principle applicable in one or more embodiments for adjusting the threshold voltage by substrate and/or well biasing. The MOS structure includes a p-type MOS (PMOS) transistor 645 and an n-type MOS (NMOS) transistor 635. PMOS transistor 645 and NMOS transistor 635 are formed on a p-type semiconductor substrate 602. PMOS transistor 645 further includes a p-doped drain region 612 and a p-doped source region 614 formed in an n-doped well 604 of substrate 602, as well as a gate 616 between drain region 612 and source region 614. NMOS transistor 635 further includes an n-doped drain region 606 and an n-doped source region 608 formed directly in substrate 602, as well as a gate 610 between drain region 606 and source region 608.

Electrical connections 618 and 620 are provided to apply one or more biasing voltages for substrate-biasing and well biasing, respectively.

In an embodiment where core transistor T31 of oscillation core 310 is a PMOS transistor, such as PMOS transistor 645, the biasing voltage from biasing voltage control circuit 390 is applied to bias a doped well, such as well 604, of the PMOS transistor. The relationship between the threshold voltage $V_{th}$ and the biasing voltage $V_{SB}$ is expressed as follows:

$$V_{th} = V_{th0} + \gamma(\sqrt{2\phi_f + V_{sb}} - \sqrt{2\phi_f})$$

where $V_{th0}$ is the threshold voltage at $V_{SB}=0$, $\gamma$ is a process related parameter, and $\phi_f$ is a physical parameter. In addition, $V_{th0}$ is also a function of the manufacturing process. Depending on manufacturing process technology, the well biasing voltage ranges between 100%~0% of the core voltage.

In another embodiment where core transistor T31 of oscillation core 310 is an NMOS transistor, such as NMOS transistor 635, the biasing voltage from biasing voltage control circuit 390 is applied to bias the substrate, such as substrate 602, of the NMOS transistor. In some implementations, a deep-n-well process is performed to bias the substrate.

As an example, at a core voltage (on power bus AVDD) of about 1.1V, appropriate well-biasing of core transistor T31 reduces the threshold voltage by approximately 100 mV and increases the "peak-to-peak swing" about 15% from 884 mV to 1020 mV.

By lowering the threshold voltage of core transistor T31, the "peak-to-peak swing" of oscillating signal 311 is increased and, hence, the SNR of oscillating signal 311 is also improved. As a result, amplified oscillating signal 321 and, subsequently, output signal 341, will also have an improved SNR.

Further, the increased "peak-to-peak swing" of oscillating signal 311 also means that one or more amplifying stages between oscillation core 310 and output buffer 340 is/are no longer necessary. For example, in some embodiments, only one amplifying stage, i.e., intermediate amplifier 320 (FIG. 3A) is required, compared to two amplifying stages, i.e., first inter-stage amplifier 120 and second inter-stage amplifier 130, in the oscillator circuits 100, 200 of FIGS. 1A, 2A. In some embodiments, intermediate amplifier 320 is the only amplifying stage between oscillation core 310 and output buffer 340. In further embodiments (not shown), no amplifying stage is required, i.e., intermediate amplifier 320 is omitted. The reduction in the number of required amplifying stages results in less noise being amplified between oscillation core 310 and output buffer 340. Other advantages include, but are not limited to, low power consumption, circuit and manufacturing process simplicity, increased chip areas for other components and/or increased chip miniaturization.

It should be noted that while threshold voltage lowering has been discussed as an example method of enlarging the "peak-to-peak swing" of the oscillating signal, other methods for enlarging the "peak-to-peak swing" or oscillation amplitude of the oscillating signal are also within the scope and spirit of this disclosure.

In one or more embodiments in accordance with a second approach, a built-in LPF, such as LPF 350, is provided to filter-out noises of frequencies higher than a predetermined frequency of LPF F35 from amplified oscillating signal 321 and to amplified and filtered oscillating signal 351 to output buffer 340.

In some embodiments, LPF 350 is implemented by additionally coupling a capacitor parallel to a preexisting power-down tie-high switch similar to transistor T2 discussed with respect to FIG. 2B. An example particular implementation of LPF 350 will be discussed in detail with respect to FIG. 4.

The addition of a capacitor to a preexisting power-down tie-high switch does not require a major re-design of the entire circuit, and consumes only a small, if any, extra chip area to accommodate such capacitor. The manufacturing process is also easily modifiable for the manufacture of LPF 350. Compared to dedicated filter circuits, a built-in LPF such as LPF 350 saves up to 90% of chip area.

Some embodiments implement both the first and second approaches. Further embodiments implement only one of the first or second approach. Yet further embodiments implement one or more other approaches for noise immunity in addition to at least one of the first or second approach.

Oscillation core 310 (FIG. 3A) is implemented in oscillator circuit 301 in a two-pin configuration. Specifically, oscillator circuit 301 includes a chip or integrated circuit 361 and oscillator element X31, e.g., a crystal, which is external (off-chip) to chip 361. Oscillator element X31 is connected to chip 361 via two pins 374, 376. Capacitors C31, C32, which are often large or bulky, are also arranged outside chip 361. Chip 361 integrates the remaining components of oscillator circuit 301 as described above.

The two-pin configuration of oscillator circuit 301 increases the chip I/O pin count which, under certain circumstances, is limited by packaging constraints.

Figure 3C:
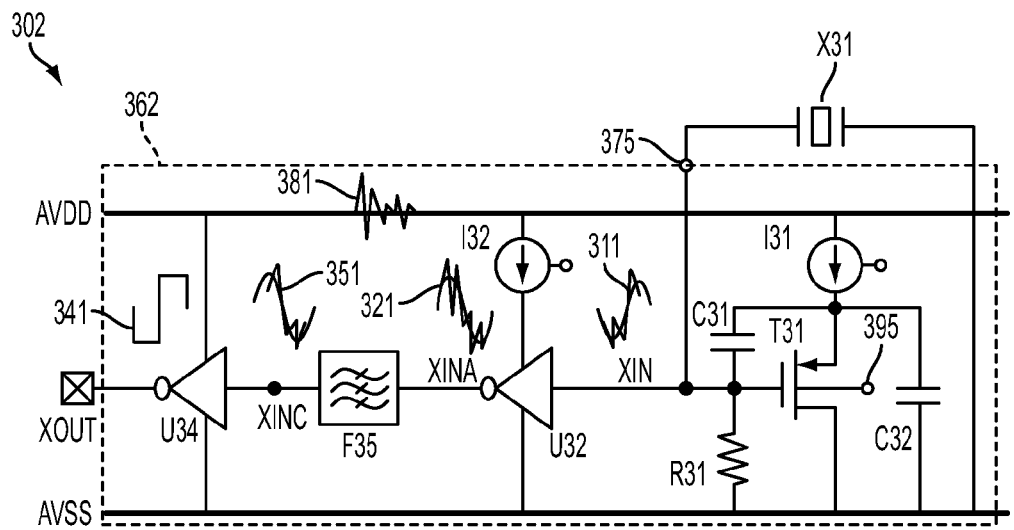

FIG. 3C is a high-level circuit diagram of an oscillator circuit 302 in accordance with one or more embodiments implementing the configuration of the oscillator circuit 300 of FIG. 3A.

Oscillator circuit 302 of FIG. 3C is similar to oscillator circuit 301 of FIG. 3B, except that oscillation core 310 is implemented in oscillator circuit 302 in a single-pin configuration. Specifically, oscillator circuit 302 includes a chip or integrated circuit 362 and oscillator element X31 which is external (off-chip) to chip 362. Oscillator element X31 is connected to chip 362 via a single pin 375. Capacitors C31, C32 are now on-chip, i.e., integrated in chip 362. Chip 362 further integrates the remaining components of oscillator circuit 301 as described above with respect to FIG. 3B.

The single-pin configuration of oscillator circuit 302 saves one I/O pin for the chip, relieves packaging constraints, reduces cost, and allows the saved I/O pin to be used for another feature.

Figure 4:
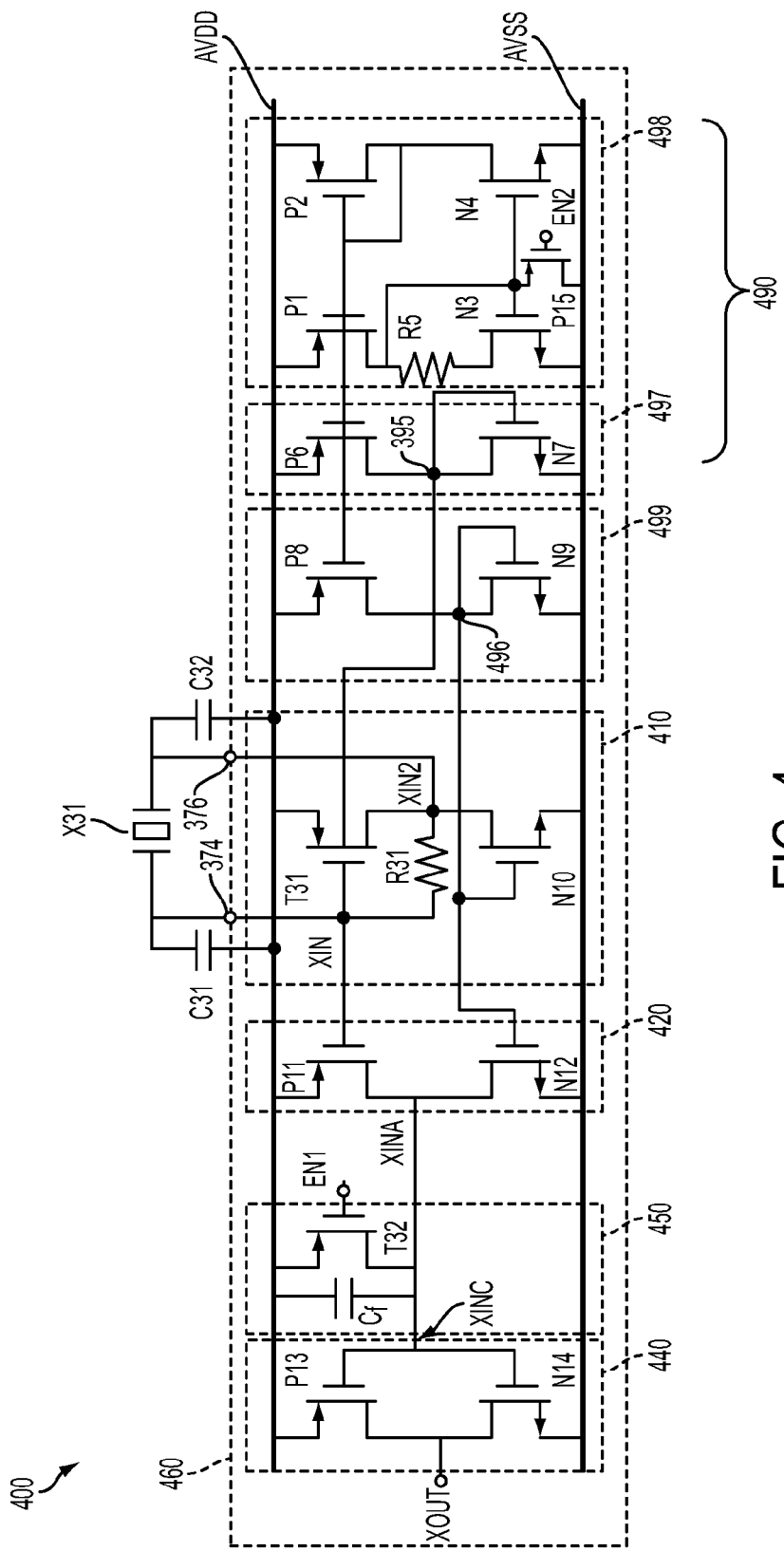
FIG. 4 is a detailed circuit diagram of an oscillator circuit in accordance with one or more embodiments.

FIG. 4 is a detailed circuit diagram of an oscillator circuit 400 in accordance with one or more embodiments.

Oscillator circuit 400 implements the two-pin configuration of oscillator circuit 301 in FIG. 3B. The single-pin configuration of oscillator circuit 302 in FIG. 3C is similarly arranged and will not be discussed in detail.

Oscillator circuit 400 includes a chip 460, an off-chip oscillator element X31, e.g., a quartz crystal, and off-chip capacitors C31, C32. Off-chip oscillator element X31 and capacitors C31, C32 together with on-chip components 410 integrated in chip 460 define an oscillation core (not numbered) of oscillator circuit 400. Chip 460 also integrates other components of oscillator circuit 400, including an output buffer 440, an LPF 450, an intermediate amplifier 420, and a biasing voltage control circuit 490.

Output buffer 440 performs the function of output buffer 340 discussed with respect to FIG. 3B. Output buffer 440 includes a PMOS transistor P13 and an NMOS transistor N14. The source of transistor P13 is connected to power bus AVDD to receive core voltage Vdd, whereas the source of transistor N14 is grounded to AVSS. The gates of transistor P13 and transistor N14 are commonly connected to node XINC. The drains of transistor P13 and transistor N14 are commonly connected to node XOUT.

Any other output buffer configuration is applicable to oscillator circuit 400 in accordance with further embodiments.

LPF 450 performs the function of LPF 350 discussed with respect to FIG. 3B. LPF 450 includes a filter capacitor $C_f$ coupled in parallel to a transistor T32.

Transistor T32 functions as a power-down tie-high switch similar to transistor T2 discussed with respect to FIG. 2B. One of the source and drain of transistor T32 is connected to power bus AVDD, whereas the other of the source and drain of transistor T32 is connected to node XINA. The gate of transistor T32 is connected to an enable pin EN1 to permit a device external to chip 460 to turn transistor T32 ON or OFF. As discussed with respect to transistor T2 (FIG. 2B), when an appropriate down-down voltage is applied to enable pin EN1, transistor T32 is closed and tie node XINA high to power bus AVDD, thereby reliably locking node XOUT at a low level.

In one or more embodiments, transistor T32 is configured, not as a power-down tie-high switch, but as a power-down tie-low switch, in which case the drain and source of transistor T32 are connected between ground AVSS and node XINA. Transistor T32 then, when enabled, ties node XINA low to ground AVSS, thereby reliably locking node XOUT at a high level.

In some embodiments, transistor T32 is a PMOS transistor as exemplarily illustrated in FIG. 4. In further embodiments, transistor T32 is a NMOS transistor.

Transistor T32 when not enabled, i.e., open, defines together with capacitor $C_f$ an LPF, e.g., an RC one dominant pole system. The capacitance of capacitor $C_f$ and the off-current resistance $R_{off}$ of transistor T32 together define a predetermined frequency (dominant pole frequency) $f_p$ of the LPF as follows:

$$f_p = 1/(2\pi R_{off} C_f)$$

LPF 450 (when transistor T32 is OFF) filters out noise frequencies higher than $f_p$ from the amplified and filtered oscillating signal on node XINA.

In some embodiments, $R_{off}$ depends on the manufacturing process and, therefore, $C_f$ is selected according to $R_{off}$ to obtain the desired $f_p$. For example, at $R_{off}$=10 MΩ, $C_f$ is selected to be 500 fF to obtain a desired $f_p$ of 32 KHz. Noise at frequencies above 32 KHz will exponentially degrade.

Intermediate amplifier 420 performs the function of intermediate amplifier 320 discussed with respect to FIG. 3B. Intermediate amplifier 420 includes a PMOS transistor P11 and an NMOS transistor N12. The source of transistor P11 is connected to power bus AVDD to receive core voltage Vdd, whereas the source of transistor N12 is grounded to AVSS. The gate of transistor P11 is connected to node XIN. The gate of transistor N12 is connected to a node 496 which will be described later. The drains of transistor P11 and transistor N12 are commonly connected to node XINA.

Transistor P11 performs the function of inverting amplifier U32. Transistor N14 performs the function of current source I32 and is enabled by the voltage from node 496.

Any other amplifying stage configuration and/or any number of amplifying stages (including zero) are applicable to oscillator circuit 400 in accordance with further embodiments.

The oscillation core defined by off-chip oscillator element X31 and capacitors C31, C32 together with on-chip components 410 performs the function of oscillation core 310 discussed with respect to FIG. 3B. The oscillation core of oscillator circuit 400 includes core transistor T31, e.g., a PMOS transistor, resistor R31 coupled to oscillator element X31 and capacitors C31, C32 in the manner discussed with respect to FIG. 3B.

The oscillation core of oscillator circuit 400 further includes an NMOS transistor N10 which performs the function of current source I31 and is enabled by the voltage from node 496.

Although a Pierce oscillation core has been disclosed, other oscillation core configurations are also applicable to oscillator circuit 400 in accordance with further embodiments. Likewise, any other current source configuration is applicable to oscillator circuit 400 in accordance with further embodiments.

Biasing voltage control circuit 490 includes a self-biasing current mirror 498 and an intermediate circuit 497. Self-biasing current mirror 498 includes PMOS transistors P1, P2, NMOS transistors N3, N4 and a resistor R5. Self-biasing current mirror 498 functions as a current source in a manner known in the art to provide a steady signal, independent of the supply voltage, at node 395 via a PMOS transistor P6 of intermediate circuit 497. Intermediate circuit 497 further includes an NMOS transistor N7 connected as a diode.

As discussed above, the signal at node 395 is a biasing voltage for biasing the well of core transistor T31 which, in some embodiments, is a PMOS transistor as illustrated in FIG. 4. In further embodiments where transistor T32 is an NMOS transistor, the biasing voltage at node 395 is coupled to bias the body or substrate or the NMOS transistor. The voltage level of the biasing voltage is adjustable by selecting resistor R5 of an appropriate resistance.

In some embodiments, self-biasing current mirror 498, and hence biasing voltage control circuit 490, is enabled or disabled by turning OFF or ON, respectively, a PMOS transistor P15 via an enable pin EN2.

Any other circuit configuration for providing a biasing voltage is applicable to oscillator circuit 400 in accordance with further embodiments.

In some embodiments, chip 460 further includes another intermediate circuit 499 which includes a PMOS transistor P8 and an NMOS transistor N9 coupled in a manner similar to PMOS transistor P6 and an NMOS transistor N7 of intermediate circuit 497. Intermediate circuit 499 is coupled to receive the steady output signal of self-biasing current mirror 498 to provide an enabling signal at node 496 for the current sources of intermediate amplifier 420 and the oscillation core, i.e., for transistors N12 and N10, respectively.

The operation of oscillator circuit 400 is similar to that of oscillator circuit 301 (FIG. 3B) and will not be repeated herein.

FIGS. 5A and 5B are exemplary time diagrams showing the noise immunity effects obtainable at a low core voltage of about 1.1V and 1 MHz noises of about 1.1 V±0.1V on power bus AVDD.

Specifically, the two upper XINA and XOUT signals in FIG. 5A are similar to first amplified oscillating signal 121 and output signal 141 at node XINA and node XOUT, respectively, in an oscillator circuit implementing the configuration of oscillator circuit 101 or 201. Both upper XINA and XOUT signals include glitches on their rising and falling edges as denoted at 521, 541, respectively.

In contrast, the two lower XINA and XOUT signals in FIG. 5A are similar to amplified oscillating signal 321 and output signal 341 at node XINA and node XOUT, respectively, in an example embodiment implementing the configuration of oscillator circuit 301 or 302. The lower XINA signal includes significantly less glitches, whereas the lower XOUT signal is essentially free of glitches, on their rising and falling edges.

Thus, in the example embodiment, noise immunity is greatly improved and accurate clock signals are obtained.

FIG. 5B are time diagrams of output signal 341 at node XOUT in the example embodiment, at several noise frequencies, e.g., 0.1 MHz, 1 MHz, and 10 MHz, on power bus AVDD. In each case, the rising and falling edges 561, 562, 563 of the output signal are essentially free of glitches. Certain fluctuations possibly exist on the top portions 571, 572, 573 of the output signals due to the connection of output buffer 340 to power bus AVDD. However, the clean, essentially glitch-free rising and falling edges 561, 562, 563 of the output signal are sufficient to provide accurate timings for external circuits.

Thus, one or both methods of improving noise immunity in an oscillator circuit is/are implemented in accordance with one or more embodiments. In the first method, the "peak-to-peak swing" or oscillation amplitude of the oscillating signal is enlarged, e.g., by appropriately biasing the core transistor in some embodiments. In the second method, a built-in LPF is included in the oscillator circuit, e.g., by simply adding a capacitor of an appropriate capacitance in parallel to a power-down tie-high (or tie-low) switch.

With the first method, a larger oscillation amplitude is obtained which increase the SNR of the oscillating signal and permits reduction of the number of amplifying stages which, in turn, results in lower power consumption and less amplified noise.

With the second method, an effective LPF is obtained without requiring a major re-design of the oscillation core and/or significant changes to the manufacturing process. The nature of advance process MOS leakage (the built-in large resistance is formed by the existing MOS switch's off-current process leakage) is utilized and chip areas are saved (the additional capacitor is only several pF in some cases).

One or both methods, when implemented in oscillator circuits, eliminate output glitches induced by bus noise of hundreds of KHz and higher without requiring complex circuitry and/or increased power consumption. The implementation in various oscillator circuit configurations does not require complex circuitry or degrading oscillation conditions.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An oscillator circuit, comprising:
an oscillation core for generating an oscillating signal;
an output buffer coupled to the oscillation core for outputting the oscillating signal; and
a biasing voltage control circuit coupled to the oscillation core for supplying a biasing voltage to the oscillation core for increasing an oscillation amplitude of the oscillating signal to thereby improve noise immunity in the oscillating signal outputted by the output buffer;
wherein
said oscillation core comprises a crystal oscillator element and a core transistor coupled to the crystal oscillator element; and
said biasing voltage control circuit is coupled to supply the biasing voltage to said core transistor to reduce a threshold voltage of the core transistor, thereby increasing the oscillation amplitude of the oscillating signal.

2. The oscillator circuit of claim 1, wherein:
said core transistor is a metal-oxide-semiconductor (MOS) transistor having a doped well in a semiconductor substrate; and
said biasing voltage control circuit is coupled to said MOS transistor for biasing said well of said MOS transistor with the biasing voltage.

3. The oscillator circuit of claim 1, wherein:
said core transistor is a metal-oxide-semiconductor (MOS) transistor on a semiconductor substrate; and
said biasing voltage control circuit is coupled to said MOS transistor for biasing said substrate of said MOS transistor with the biasing voltage.

4. The oscillator circuit of claim 1, wherein:
the biasing voltage is between 0% and 100% of a supply voltage of the oscillator circuit.

5. An oscillator circuit, comprising:
an oscillation core for generating an oscillating signal;
an output buffer coupled to the oscillation core for outputting the oscillating signal; and
a low pass filter (LPF) coupled between the oscillation core and the output buffer for filtering noise at frequencies higher than a predetermined frequency of said LPF from the oscillating signal before supplying said oscillating signal to the output buffer;
wherein
said LPF comprises a metal-oxide-semiconductor (MOS) transistor and a capacitor coupled in parallel to the MOS transistor;
a capacitance of the capacitor and an off-current resistance of the MOS transistor together define the predetermined frequency of the LPF;
one of the source and the drain of said MOS transistor is directly coupled to a first terminal of the capacitor and to a power supply voltage node of the oscillator circuit; and
the other of the source and the drain of said MOS transistor is directly coupled to a second terminal of the capacitor and to a node configured to receive the oscillating signal.

6. An oscillator circuit, comprising:
an oscillation core for generating an oscillating signal;
an output buffer coupled to the oscillation core for outputting the oscillating signal;
a low pass filter (LPF) coupled between the oscillation core and the output buffer for filtering noise at frequencies higher than a predetermined frequency of said LPF from the oscillating signal before supplying said oscillating signal to the output buffer; and
an intermediate amplifier coupled between the oscillation core and the LPF for amplifying the oscillating signal and supplying the amplified oscillating signal to the LPF.

7. The oscillator circuit of claim 6, wherein
said intermediate amplifier is the only amplifying circuit between the oscillation core and the output buffer.

8. The oscillator circuit of claim 6, wherein:
said oscillation core comprises a Pierce oscillation core.

9. The oscillator circuit of claim 6, further comprising:
a biasing voltage control circuit coupled to the oscillation core for supplying a biasing voltage to the oscillation core for increasing an oscillation amplitude of the oscillating signal to thereby improve noise immunity in the oscillating signal outputted by the output buffer.

10. An integrated circuit for connection to an off-chip oscillator element for generating an oscillating signal, said integrated circuit comprises:
an intermediate amplifier coupled to receive and amplify the oscillating signal;
a low pass filter (LPF) coupled to the intermediate amplifier for filtering noise at frequencies higher than a predetermined frequency of said LPF from the amplified oscillating signal; and
an output buffer coupled to the LPF for outputting the amplified and filtered oscillating signal;
wherein
said LPF comprises a metal-oxide-semiconductor (MOS) transistor and a capacitor coupled in parallel between a source and a drain of the MOS transistor; and
a capacitance of the capacitor and an off-current resistance of the MOS transistor together define the predetermined frequency of the LPF.

11. The integrated circuit of claim 10, wherein said MOS transistor is configured as a power down tie-high switch in which
one of the source and the drain of said MOS transistor is coupled to receive a power supply voltage of the integrated circuit; and
the other of the source and the drain of said MOS transistor is coupled to an output of the intermediate amplifier for receiving the amplified oscillating signal.

12. The integrated circuit of claim 11, further comprising:
a further MOS transistor connectable to the off-chip oscillator element to define together with the off-chip oscillator element an oscillation core for generating the oscillating signal; and
a biasing voltage control circuit coupled to supply a biasing voltage to said further MOS transistor to reduce a threshold voltage of the further MOS transistor, thereby increasing an oscillation amplitude of the oscillating signal.

13. The integrated circuit of claim 12, wherein:
said biasing voltage control circuit is coupled to said further MOS transistor for biasing a doped well of said further MOS transistor with the biasing voltage.

14. The integrated circuit of claim 12, wherein:
said biasing voltage control circuit is coupled to said further MOS transistor for biasing a semiconductor substrate of said further MOS transistor with the biasing voltage.

15. A method of improving noise immunity of an oscillator circuit which has an oscillation core for generating an oscillating signal and an output buffer coupled to the oscillation core for outputting the oscillating signal, said method comprising:
supplying a biasing voltage to the oscillation core for increasing an oscillation amplitude of the oscillating signal to thereby improve noise immunity in the oscillating signal outputted by the output buffer;
wherein
said oscillation core comprises a crystal oscillator element and a core transistor coupled to the crystal oscillator element; and
in said supplying, the biasing voltage is supplied to said core transistor to reduce a threshold voltage of the core transistor, thereby increasing the oscillation amplitude of the oscillating signal.

16. The method of claim 15, wherein the oscillator circuit further has a power down tie-high or tie-low switch between the oscillation core and the output buffer;
said method further comprising:
configuring said switch as a low pass filter (LPF) for filtering noise at frequencies higher than a predetermined frequency of said LPF from the oscillating signal before supplying said oscillating signal to the output buffer.

17. The method of claim 16, wherein:

said switch includes a metal-oxide-semiconductor (MOS) transistor;

said configuring comprises coupling a capacitor in parallel between a source and a drain of the MOS transistor; and a capacitance of the capacitor and an off-current resistance of the MOS transistor together define the predetermined frequency of the LPF.

18. The method of claim 15, wherein said core transistor comprises a metal-oxide-semiconductor (MOS) transistor having a doped well in a semiconductor substrate; and said biasing voltage is at least one of a well-biasing voltage or a substrate-biasing voltage that biases at least one of said well or said substrate of said MOS transistor, respectively.

* * * * *